US010255004B2

(12) United States Patent
Kang et al.

(10) Patent No.: US 10,255,004 B2
(45) Date of Patent: Apr. 9, 2019

(54) SYSTEMS AND METHODS FOR MANAGING ADDRESS-MAPPING DATA IN MEMORY DEVICES

(71) Applicant: Marvell World Trade Ltd., St. Michael (BB)

(72) Inventors: Xinhai Kang, Milpitas, CA (US); Wei Xu, Milpitas, CA (US)

(73) Assignee: Marvell World Trade Ltd., St. Michael (BB)

( * ) Notice: Subject to any disclaimer, the term of this patent is extended or adjusted under 35 U.S.C. 154(b) by 95 days.

(21) Appl. No.: 15/349,063

(22) Filed: Nov. 11, 2016

(65) Prior Publication Data

US 2017/0139773 A1 May 18, 2017

Related U.S. Application Data

(60) Provisional application No. 62/255,794, filed on Nov. 18, 2015.

(51) Int. Cl.
G06F 3/06 (2006.01)
G11C 29/52 (2006.01)
G06F 11/10 (2006.01)
G11C 29/04 (2006.01)

(52) U.S. Cl.
CPC ............ G06F 3/0679 (2013.01); G06F 3/064 (2013.01); G06F 3/0619 (2013.01); G06F 3/0661 (2013.01); G06F 11/1012 (2013.01); G11C 29/52 (2013.01); G11C 2029/0411 (2013.01)

(58) Field of Classification Search
CPC .... G06F 3/0679; G06F 11/1012; G06F 3/064; G06F 3/0619; G06F 3/0661; G11C 29/52; G11C 2029/0411
See application file for complete search history.

(56) References Cited

U.S. PATENT DOCUMENTS

| 2011/0154160 | A1* | 6/2011 | Yurzola | G06F 11/1048 714/763 |
| 2014/0258588 | A1* | 9/2014 | Tomlin | G06F 12/0246 711/103 |
| 2015/0046772 | A1* | 2/2015 | Bennett | G06F 11/0787 714/768 |
| 2015/0154118 | A1* | 6/2015 | Marcu | G06F 12/1009 711/206 |
| 2015/0309886 | A1* | 10/2015 | Tsai | G06F 11/1469 714/19 |

(Continued)

OTHER PUBLICATIONS

Jim Chen, D. Har, K. Mak, C. Schulz, B. Tremaine and M. Wazlowski, "Reliability-availability-serviceability characteristics of a compressed-memory system," Proceeding International Conference on Dependable Systems and Networks. DSN 2000, New York, NY, 2000, pp. 163-168.*

(Continued)

*Primary Examiner* — Cynthia Britt

(57) ABSTRACT

Methods, apparatuses, and data storage devices are provided. Address-mapping data is compressed. The address-mapping data indicates mapping from a logical address to a physical address of a non-volatile memory of a storage device. Error checking and correction (ECC) data for the compressed address-mapping data is generated. The compressed address-mapping data and the ECC data are stored in the storage device.

14 Claims, 4 Drawing Sheets

(56) References Cited

U.S. PATENT DOCUMENTS

| | | | |
|---|---|---|---|
| 2016/0034388 A1* | 2/2016 | Yeh | G06F 12/0246 |
| | | | 711/103 |
| 2016/0054940 A1* | 2/2016 | Khoueir | G06F 12/0638 |
| | | | 706/15 |
| 2017/0075807 A1* | 3/2017 | Tomlin | G06F 12/0253 |
| 2017/0131925 A1* | 5/2017 | Kim | G06F 3/0608 |
| 2017/0286213 A1* | 10/2017 | Li | G06F 11/108 |

OTHER PUBLICATIONS

"A Flash Storage Technical and Economic Primer". flashstorage.com. Mar. 30, 2015. Archived from the original on Jul. 20, 2015.*

Y. Wang, M. Huang, Z. Shao, H. C. B. Chan, L. A. D. Bathen and N. D. Dutt, "A Reliability-Aware Address Mapping Strategy for NAND Flash Memory Storage Systems," in IEEE Transactions on Computer-Aided Design of Integrated Circuits and Systems, vol. 33, No. 11, pp. 1623-1631, Nov. 2014.*

* cited by examiner

SYSTEMS AND METHODS FOR MANAGING ADDRESS-MAPPING DATA IN MEMORY DEVICES

CROSS-REFERENCE TO RELATED APPLICATIONS

This application claims priority to U.S. Provisional Patent Application No. 62/255,794, filed Nov. 16, 2015, entitled "Mapping Data Compression" which is incorporated herein by reference in its entirety.

FIELD

The present disclosure relates generally to data storage devices and more particularly to systems and methods for managing address-mapping data in data storage devices.

BACKGROUND

Many electronic devices have been used for data storage, such as Hard Disk Drives (HDDs) and Solid State Drives (SSDs). Compared with HDDs, SSDs typically have fewer mechanical defects and lower power consumption. Further, SSDs execute read and write operations more quickly than HDDs in some instances.

The description above presented as a general overview of related art in this field and should not be construed as an admission that any of the information it contains constitutes prior art against the present patent application.

SUMMARY

Examples of a method, apparatus, and data storage device are provided. In an example method, address-mapping data is compressed. The address-mapping data indicates mapping from a logical address to a physical address of a non-volatile memory of a storage device. Error checking and correction (ECC) data for the compressed address-mapping data is generated. The compressed address-mapping data and the ECC data are stored in the storage device.

An example apparatus includes a processing system configured to compress address-mapping data. The apparatus also includes a storage device comprising a non-volatile memory. The address-mapping data indicates mapping from a logical address to a physical address of the non-volatile memory. The storage device also comprises a controller unit configured to generate error checking and correction (ECC) data for the compressed address-mapping data. The controller unit is further configured to write the compressed address-mapping data and the ECC data to the storage device.

An example data storage device includes a non-volatile memory and a controller unit. The controller unit is configured to compress address-mapping data, where the address-mapping data indicates mapping from a logical address to a physical address of the non-volatile memory. The controller unit is also configured to generate error checking and correction (EEC) data for the compressed address-mapping data. The controller unit is further configured to write the compressed address-mapping data and the ECC data to the storage device.

DETAILED DESCRIPTION

The present disclosure is directed to storage devices and more particularly to storage devices that utilize address-mapping data (e.g., Flash Translation Layer (FTL) address-mapping data) indicating mapping from logical addresses to physical addresses of a memory (e.g., a non-volatile memory). As described in further detail below, in embodiments of the present disclosure, address-mapping data is compressed. Compressing the address-mapping data enables a stronger level of error protection to be applied to the address-mapping data (e.g., a larger number of error checking and correction (ECC) bytes can be stored for a given unit of address-mapping data). The stronger level of error protection helps to protect against loss or corruption of the address-mapping data. These aspects and others of the present disclosure are described in further detail below.

Figure 1:
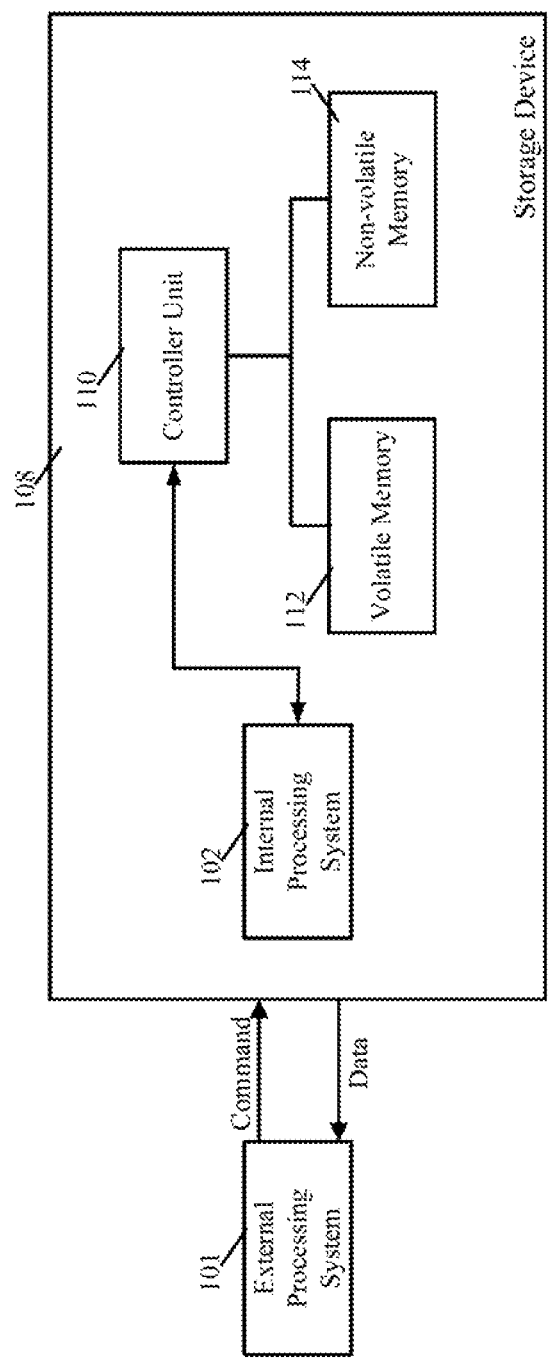
FIG. 1 is a block diagram illustrating an example memory system according to an embodiment of the present disclosure.

FIG. 1 is a block, diagram illustrating an example memory system according to an embodiment of the present disclosure. The example memory system of FIG. 1 includes a data storage device 108 (e.g., a Solid State Drive (SSD)) including a controller unit 110 (e.g., a flash controller, etc.), a volatile memory 112, and a non-volatile memory 114. In some embodiments, user data is stored on the non-volatile memory 114 so that the user data will not be lost upon power failure. Further, in some embodiments, the volatile memory 112 includes one or more dynamic random-access memory (DRAM) devices, and the non-volatile memory 114 includes one or more flash memory devices (e.g., one or more NAND flash memories). In some embodiments, the non-volatile memory 114 is divided into storage blocks, and each storage block comprises multiple pages. In these embodiments, reading and programming the non-volatile memory 114 is performed on a per-page basis, and erasure is performed on a per-block basis.

The controller unit 110 performs memory management functions for the non-volatile memory 114 and also has the capability of executing algorithms (e.g., software, firmware, etc.), in some embodiments. The memory management functions, described in further detail below, include compressing address-mapping data, applying error correction encoding and decoding to data, and writing data to the non-volatile memory 114, among other functions, in embodiments. The controller unit 110 can be any type of memory controller that manages memory access, including but not limited to a flash disk controller or one or more processing units (e.g., processors, central processing units (CPUs) including one or more internal caches, etc.). Further, in some embodiments, the controller unit 110 is implemented using computer logic, state machine(s), ASIC, FPGA, DSP, other integrated circuits, etc.

The controller unit 110 is coupled to an internal processing system 102 of the data storage device 108 in the example of FIG. 1. In some embodiments, the internal processing system 102 is part of a host system that may be any type of electronic device that uses the non-volatile memory 114, including but not limited to a computer, an embedded device, or handheld device, such as a cell phone, smartphone, camera, gaming system, monitor, or personal digital assistant (PDA), for instance. In embodiments, the internal processing system 102 comprises one or more processing units, integrated circuits, computer logic, state machine(s), ASIC, FPGA, DSP, etc. The internal processing system 102, controller unit 110, volatile memory 112, and non-volatile memory 114 may be implemented as individual chips, a chipset, or as a system-on-a-chip (SoC), for instance.

The internal processing system 102 performs translation management that maps logical blocks into physical blocks in the non-volatile memory 114. To do so, the internal processing system 102 maintains a logical-to-physical translation map between logical addresses and physical addresses of pages in the not-volatile memory 114. In some embodiments, the internal processing system 102 stores the translation maps as one or more tables or data structures in the volatile memory 112 and/or the non-volatile memory 114. When the internal processing system 102 receives a memory access request (e.g., a read command, a write command) associated with a logical address, the internal processing system 102 determines a physical address of the non-volatile memory 114 corresponding to the logical address using the logical-to-physical translation data. This enables reading of requested data from the non-volatile memory 114 and writing of data to the non-volatile memory 114. In some embodiments, the internal processing system 102 executes software and/or firmware to perform the above-described translation management functions.

In the example of FIG. 1, the internal processing system 102 receives commands to access the non-volatile memory 114 from an external processing, system 101 that is not a part of the storage device 108. The commands include read commands and write commands, with each command being associated with a logical address. As described above, the internal processing system 102 uses logical-to-physical address mapping data to derive physical addresses of the not-volatile memory 114 from the logical addresses provided by the external processing system 101. For read commands, using the derived physical addresses, the requested data of the non-volatile memory 114 is returned to the external processing system 101, as shown in FIG. 1. For write commands, using the derived physical addresses, data from the external processing system 101 is written to the non-volatile memory 114.

In some embodiments, the data storage device 108 implements Flash Translation Layer (FTL) for managing data storage in the device 108. FTL is an internal software layer used in performing, a number of functions, including the above-described logical-to-physical address translation. FTL is also used, in embodiments, in performing the functions of garbage collection for reclaiming used blocks of the non-volatile memory 114 and wear leveling to increase, a lifespan of the non-volatile memory 114. To implement these functions, one or more data structures are used for the FTL, such as an address-mapping table (e.g., comprising address-mapping data), a pool of free blocks, and one or more lists of garbage blocks with erase counts. These data structures store data that may be referred to as "FTL metadata." The internal processing system 102 and/or controller unit 110 make use of the FTL metadata to perform the functions noted above.

Address-mapping data and other FTL metadata are stored in the volatile memory 112 and/or the non-volatile memory 114, in some embodiments. One approach is to load all FTL metadata (e.g., including the address-mapping data) to the volatile memory 112 during data storage operations and store the FTL metadata back onto the non-volatile memory 114 at system shutdown. However, the volatile memory 112 has a limited size, in some embodiments. Because the size of the FTL metadata is proportional to the total capacity of the data storage device 108, loading the entire FTL metadata to the volatile memory 112 is not feasible in some situations. Further, in some situations, it is not feasible to store all of the address-mapping data (e.g., the entire address-mapping table) to the volatile memory 112. For instance, 1 GiB of logical space utilizes 1 Mib of address-mapping data, and it is infeasible to store the 1 MiB of address-mapping data in the volatile memory 112, in some embodiments.

In situations where it is not feasible to store all of the address-mapping data on the volatile memory 112, FTL dynamically moves address-mapping data between the volatile memory 112 and the non-volatile memory 114, in some embodiments. For instance, address-mapping data is transferred into the volatile memory 112 from the non-volatile memory 114 and is likewise transferred out of the volatile memory 112 to the non-volatile memory 114. When the address-mapping data is dynamically swapped between the memories 112, 114 in this manner, there is a risk of losing or corrupting the address-mapping data. The loss or corruption of address-mapping data is undesirable. For instance, in an embodiment, losing a single 4 KiB unit of address-mapping data results in losing 4 MiB of data stored on the non-volatile memory 114.

One method of protecting the address-mapping data from data loss is through the use of error detection and correction coding (e.g., error checking and correction (ECC) coding, low-density party-check (LDPC) coding, etc.). In applying such error detection and correction coding, to the address-mapping data, redundancy or parity bits (e.g., ECC bits or bytes) that correspond to the address-mapping data are generated. The redundancy or parity bits enable a certain number of bit errors in the address-mapping data to be corrected, where a number of errors that can be corrected increases with the number of redundancy or parity bits utilized. Thus, by using a larger number of redundancy or parity bits (e.g., a larger number of ECC data bytes), stronger error protection is provided. For example, for a 2 KiB unit of address-mapping data, adding 64 ECC bytes adds approximately 32 bit correction power. In the present disclosure, "ECC data bytes" are referred to throughout. It is noted, however, that other types of redundancy and parity bits are utilized in embodiments of the present disclosure (e.g., redundancy or parity bits generated via LDPC coding, etc.).

In some embodiments, the ability to increase the number of ECC data bytes is limited by parameters of the non-volatile memory 114. As noted above, writing to the non-volatile memory 114 is on a per-page basis, where each page has a predetermined page size (e.g., 16 KiB). In some embodiments, the ability to increase the number of ECC data bytes is limited by the page size of the non-volatile memory 114. Specifically, in some embodiments, the following condition limits the ability to increase the number of ECC data bytes: [(Address-mapping data unit size)+(ECC data bytes)] ≤Page size of non-volatile memory 114 It is noted that the condition above is only an example and that other conditions apply in other embodiments. For instance, in other embodiments, the sum of the address-mapping data unit size and the ECC data bytes must be less than or equal to some multiple of the page size of the non-volatile memory 114 (e.g., two or three times the page size, etc.).

From the example condition above, it can be seen that if the size of the address-mapping data unit is equal to the page size of the non-volatile memory 114, there is no room for any ECC data bytes. Likewise, if the size of the address-mapping data unit is nearly equal to the size of the page size, there is only room for a small number of ECC data bytes. If no ECC data bytes or only a small number of ECC data bytes are used, no error protection or only weak error protection is provided. As noted above, the loss of address-mapping data should be avoided, and thus, the inability to provide stronger ECC protection is undesirable. Conventional systems and methods suffer from this inability to provide stronger ECC protection.

The techniques of the present disclosure eliminate or mitigate this deficiency of the conventional approaches. Specifically, using the systems and methods described herein, stronger error protection is applied to the address-mapping data, as compared to the conventional systems and methods. Under the techniques of the present disclosure, in order to apply the stronger error protection to the address-mapping data (e.g., utilize a larger number of ECC data bytes), the address-mapping data is compressed. The address-mapping data is compressed, in embodiments, by the internal processing system 102 and/or the controller unit 110. Error correction encoding (e.g., ECC coding, etc.) is then applied to the compressed address-mapping data to generate ECC data bytes for the compressed data. Such error correction encoding, is performed by the internal processing system 102 and/or the controller unit 110, in some embodiments. Because the address-mapping data has been compressed, more ECC data bytes can be used, thus providing a higher level of error protection (e.g., stronger ECC protection).

The compressed address-mapping data and the ECC data bytes are stored in the data storage device 108, e.g., in the volatile memory 112 and/or the non-volatile memory 114. Subsequently, the compressed address-mapping data and the ECC data bytes are read from storage, decoded using a suitable decoding scheme, and decompressed. The decompressed address-mapping data is used by the internal processing system 102 in performing logical-to-physical address translation, as described above. The non-volatile memory 114 is accessed (e.g., accessed for a read operation or a write operation) using the physical address derived via the address translation procedure. Additional details on the compression, encoding, decoding, and decompression operations are provided below.

Figure 2:
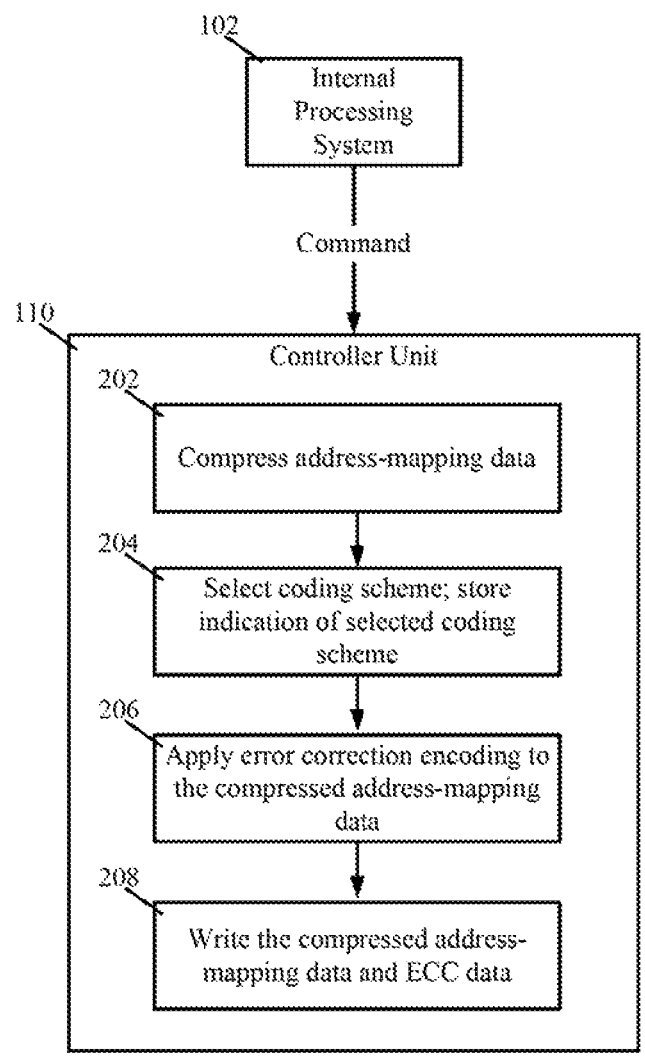
FIG. 2 depicts an example of storing address-mapping data in a data storage device, according to an embodiment of the present disclosure.

FIG. 2 depicts an example of storing address-mapping data (e.g., FTL metadata, etc.) in a data storage device (e.g., the data storage device 108 of FIG. 1), according to an embodiment of the present disclosure. As described above, the address-mapping data indicates mapping from a logical address to a physical address of a non-volatile memory (e.g., the non-volatile memory 114 of FIG. 1) of a storage device. In the storing of the address-mapping data, a command to write the address-mapping data to the data storage device 108 is transferred from the internal processing system 102 to the controller unit 110. In some embodiments, the command includes the address-mapping data to be stored. Further, in some embodiments, the address-mapping data is compressed by the internal processing system 102 prior to being transferred to the controller unit 110. In these embodiments, the internal processing system 102 executes a compression algorithm (e.g., via software, firmware, etc.) to compress the address-mapping data.

In other embodiments, the compression is performed on-the-fly, without software intervention. In these other embodiments, the internal processing system 102 transfers the uncompressed address-mapping data and a suitable command (e.g., a command indicating "write 16 KiB address-mapping data" to the storage device 108, etc.) to the controller unit 110. The controller unit 110 subsequently compresses the address-mapping data (e.g., without aid of software executed by the internal processing system 102). The compression of the address-mapping data by the controller unit 110, utilized in some embodiments, is illustrated in FIG. 2 at an operation 202. It is noted that compression of the address-mapping data is performed either in the controller unit 11 or outside of the controller unit 110 (e.g., by the internal processing system 102 executing compression software, as described above) in embodiments of the present disclosure.

At an operation 204, the controller unit 110 selects a coding scheme of a plurality of coding schemes to be used in generating error checking and correction data for the compressed address-mapping data. As described herein, in embodiments, the coding scheme is error checking and correction (ECC) coding, low-density parity-check (LDPC) coding, or another coding scheme suitable for generating the error checking and correction data redundancy or parity bits, such as ECC bits or bytes, etc.).

In some embodiments, the coding scheme is selected based on a degree to which the address-mapping data is compressed. For instance, in an embodiment, a first coding scheme is selected based on a determination that the address-mapping data is highly compressed (e.g., data is determined to be "compressible"), and a second coding scheme is selected based on a determination that the address-mapping data is minimally compressed (e.g., data is determined to be "non-compressible"). The first coding scheme is different than the second coding scheme. In an example of this embodiment, a 4 KiB unit of address-mapping data is determined to be "highly compressed" (e.g., compressible) if it is compressed to a size that is less than or equal to (4 KiB-128 bytes). If the 4 KiB unit of address-mapping data is compressed to a size that is greater than (4 KiB-128 bytes), it is determined to be "minimally compressed" (e.g., non-compressible).

In an example of this embodiment, applying the first coding scheme to the address-mapping data results in the generation of a relatively large number of EEC data bytes for the address-mapping data. Conversely, applying the second coding scheme to the address-mapping data results in the generation of a relatively small number of ECC data bytes for the address-mapping data. This is because when the address-mapping data is highly compressed, there is more room for ECC data bytes, and thus, a coding scheme configured to get crate a larger number of ECC data bytes (e.g., a stronger level of ECC protection) is utilized. By contrast, when the address-mapping data is minimally compressed, there is less room for ECC data bytes, and thus, a coding scheme configured to generate a smaller number of ECC data bytes (e.g., a weaker level of ECC protection) is utilized. Address-mapping data is typically highly compressible, such that the benefits of stronger ECC protection are often obtained.

In some embodiments, an indication of the selected coding scheme is saved in the data storage device 108 (e.g., in the volatile memory 112 or the non-volatile memory 114). Later, when the address-mapping data is to be read out, a decoding scheme for decoding the address-mapping data is selected based on the stored indication. The selection of the decoding scheme based on the stored indication is described in further detail below with reference to FIG. 3.

At an operation 206 performed by the controller unit 110, ECC data bytes are generated by applying error correction encoding to the compressed address-mapping data. Subsequently, at an operation 208 performed by the controller unit 110, the compressed address-mapping data and the ECC data bytes are written to the data storage device 108. In some embodiments, the compressed address-mapping data and the ECC data bytes are written to the volatile memory 112. In other embodiments, the compressed address-mapping data and the ECC data bytes are written to the non-volatile memory 114. As noted above, swapping of address-mapping data between the volatile memory 112 and the non-volatile memory 114 is typical, such that the data may ultimately reside on either of the memories 112, 114. In some embodiments of the present disclosure, a combined size of a unit of the compressed address-mapping data and its corresponding ECC data is less than or equal to a page size of the non-volatile memory 114. As described herein, by compressing the address-mapping data, a number of ECC data bytes can be larger than in the conventional approaches while still enabling the address-mapping data and ECC data to fit within a page of the non-volatile memory 114.

Figure 3:
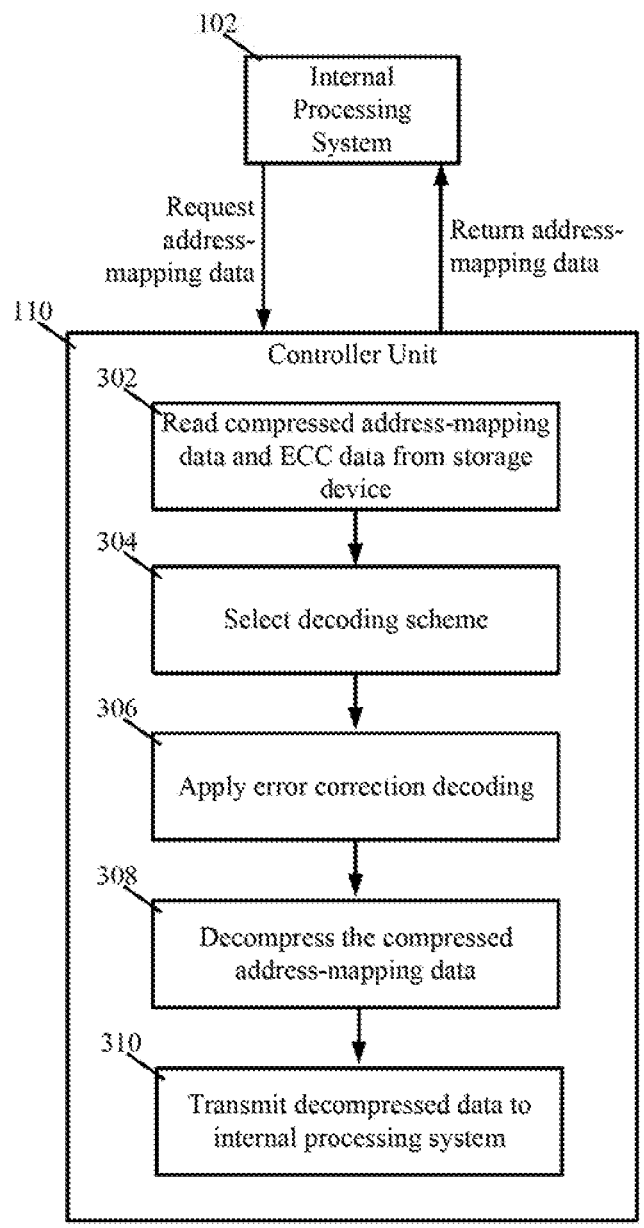
FIG. 3 depicts an example of retrieving address-mapping data in a data storage device, according to an embodiment of the present disclosure.

FIG. 3 depicts an example of retrieving address-mapping data in a data storage device, according to an embodiment of the present disclosure. After storing the compressed address-mapping data and ECC data to the storage device 108 (e.g., as described above with reference to FIG. 2), it may be necessary to retrieve the address-mapping data (e.g., read out the address-mapping data) in order to perform logical-to-physical address translation. For instance, in some embodiments, the internal processing system 102 receives a command to access the non-volatile memory 114, where the command is a read command or a write command associated with a logical address. The read or write command is received from the external processing system 101 or another component, in embodiments. Responsive to the receipt of the command, the internal processing system 102 transmits a request for address-mapping data to the controller unit 110, as shown in FIG. 3. Subsequently, at an operation 302, the controller unit 110 reads compressed address-mapping data and its corresponding ECC data from the data storage device 108. The compressed address-mapping data and its corresponding ECC data may be stored in either the volatile memory 112 or the non-volatile memory 114, such that the controller 110 reads the data from one of these two memories 112, 114, in embodiments.

At an operation 304, the controller unit 110 selects a decoding scheme of a plurality of decoding schemes for decoding the data that is read from the data storage device 108. As described above, in some embodiments, when the address-mapping data is encoded, an indication of the selected coding scheme is stored in the data storage device 108. Accordingly, in these embodiments, the controller unit 110 retrieves the stored indication and selects a suitable decoding scheme based on the stored indication. For instance, if the stored indication indicates that a particular ECC code was used to encode the address-mapping data, a decoding scheme suitable for decoding data encoded with the particular ECC code is selected based on the stored indication. It is noted that even in situations where the coding scheme used to encode the address-mapping data is not known (e.g., code selection information lost, corrupted, or never stored, etc.), a suitable decoding scheme can nonetheless be selected. For instance, if the coding scheme is not known, a first decoding scheme is selected and applied. If the first decoding scheme is unsuccessful in decoding the address-mapping data, a second decoding scheme is selected and applied. Decoding schemes are selected and applied until the address-mapping data is successfully decoded.

At an operation 306, error correction decoding is applied to the compressed address-mapping data and ECC data retrieved from the data storage device 108. The error correction decoding is applied according to the decoding scheme selected in the operation 304. Subsequently, at an operation 308, the compressed address-mapping data is decompressed. In some embodiments, the decompressing of the address-mapping data is performed by the controller unit 110. In these embodiments, at an operation 310, the decompressed address-mapping data is transmitted from the controller unit 110 to the internal processing system 102, thus enabling the internal processing system 102 to perform the logical-to-physical address translation described above. In other embodiments, the decompressing of the address-mapping data is performed by the internal processing system 102. In these other embodiments, after applying the error correction decoding, the controller unit 110 transmits the decoded, compressed address-mapping data to the internal processing system 102, and the internal processing system 102 decompresses the data. The transferring of address-mapping data from the controller unit 110 to the internal processing system 102 (e.g., in either compressed or decompressed form) is illustrated in FIG. 3.

After the address-mapping data is decompressed (e.g., by the internal processing system 102 or the controller unit 110, as described above), the decompressed data is used to derive a physical address of the non-volatile memory 114 that corresponds to the logical address of the read or write command. Using the derived physical address, the non-volatile memory 114 is accessed to complete the requested read or write operation.

Figure 4:
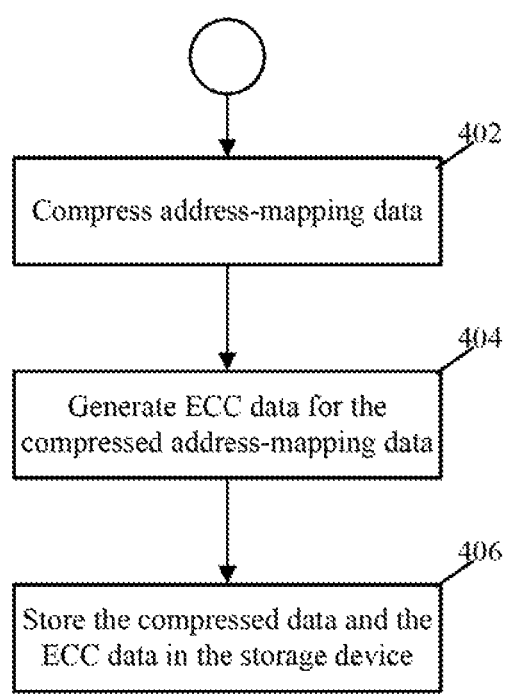
FIG. 4 is a flowchart depicting operations of an example method for managing storing of address-mapping data in a data storage device, according to an embodiment of the present disclosure.

FIG. 4 is a flowchart depicting operations of an example method for management of address-mapping data in a data storage device, according to an embodiment of the present disclosure. FIG. 4 is described with reference to FIG. 1 above for ease of understanding, but the process of FIG. 4 is applicable to other configurations (e.g., hardware and/or software configurations, etc.) as well. At 402, address-mapping data is compressed. In the example of FIG. 1, compressing of address-mapping data is performed by the internal processing system 102 and/or the controller unit 110. The address-mapping data indicates mapping from a logical address to a physical address of a non-volatile memory of a storage device (e.g., the non-volatile memory 114 of the storage device 108 in FIG. 1). At 404 error checking and correction (ECC) data for the compressed address-mapping data is generated. In the example of FIG. 1, the generation of the ECC data is performed by the internal processing system 102 and/or the controller unit 110. At 406, the compressed address-mapping data and the ECC data are stored in the storage device (e.g., the volatile memory 112 and/or the non-volatile memory 114 of the storage device 108).

This application uses examples to illustrate the invention. The patentable scope of the invention may include other examples.

What is claimed is:

1. A method comprising:
   compressing address-mapping data, the address-mapping data indicating mapping from a logical address to a physical address of a non-volatile memory of a storage device;
   selecting a coding scheme of a plurality of coding schemes;

generating error checking and correction (ECC) data for the compressed address-mapping data using the selected coding scheme, the selecting being based on a degree to which the address-mapping data is compressed, such that a combined size of the compressed address-mapping data and the ECC data is less than or equal to a page size of the non-volatile memory; and storing the compressed address-mapping data and the ECC data in the storage device.

2. The method of claim 1, wherein the selecting comprises:

selecting a first coding scheme of the plurality of coding schemes based on a determination that the address-mapping data is highly compressed; and selecting a second coding scheme of the plurality of coding schemes based on a determination that the address-mapping data is minimally compressed, wherein the first coding scheme is different than the second coding scheme.

3. The method of claim 1, wherein the generating of the ECC data comprises applying error correction encoding to the compressed address-mapping data according to the selected coding scheme, the method further comprising:

storing an indication of the selected coding scheme in the storage device;

reading the compressed address-mapping data and the ECC data from the storage device;

selecting a decoding scheme of a plurality of decoding schemes based on the stored indication; and applying error correction decoding to the data that is read from the storage device, the error correction decoding being applied according to the selected decoding scheme.

4. The method of claim 1, wherein the compressed address-mapping data and the ECC data are stored to the non-volatile memory of the storage device.

5. The method of claim 1 wherein the compressed address-mapping data and the ECC data are stored to a volatile memory of the storage device.

6. The method of claim 1, further comprising:

receiving a command to access the non-volatile memory of the storage device, the command being a read command or a write command associated with the logical address;

responsive to the receipt of the command, reading the compressed address-mapping data and the ECC data from the storage device;

applying error correction decoding to the data that is read from the storage device;

decompressing the compressed address-mapping data after the applying of the error correction decoding;

using the decompressed data to derive the physical address from the logical address; and accessing the non-volatile memory using the derived physical address.

7. An apparatus comprising:

a processing system configured to compress address-mapping data; and a storage device comprising:

a non-volatile memory, the address-mapping data indicating mapping from a logical address to a physical address of the non-volatile memory, and a controller unit configured to (i) select a coding scheme of a plurality of coding schemes, (ii) generate error checking and correction (ECC) data for the compressed address-mapping data using the selected coding scheme, the selection being based on a degree to which the address-mapping data is compressed, such that a combined size of the compressed address-mapping data and the ECC data is less than or equal to a page size of the non-volatile memory, and (iii) write the compressed address-mapping data and the ECC data to the storage device.

8. The apparatus of claim 7, wherein the controller unit is further configured to:

select a first coding scheme of the plurality of coding schemes based on a determination that the address-mapping data is highly compressed; and select a second coding scheme of the plurality of coding schemes based on a determination that the address-mapping data is minimally compressed, wherein the first coding scheme is different than the second coding scheme.

9. The apparatus of claim 7, wherein the controller unit is further configured to:

generate the ECC data by applying error correction encoding to the compressed address-mapping data according to the selected coding scheme;

store an indication of the selected coding scheme in the storage device;

read the compressed address-mapping data and the ECC data from the storage device;

select a decoding scheme of a plurality of decoding schemes based on the stored indication; and apply error correction decoding to the data that is read from the storage device, the error correction decoding being applied according to the selected decoding scheme.

10. The apparatus of claim 7, wherein the compressed address-mapping data and the ECC data are written to the non-volatile memory of the storage device.

11. A storage device comprising:

a non-volatile memory; and a controller unit configured to compress address-mapping data, the address-mapping data indicating mapping from a logical address to a physical address of the non-volatile memory, select a coding scheme of a plurality of coding schemes, generate error checking and correction (ECC) data for the compressed address-mapping data using the selected coding scheme, selection of the selected coding scheme being based on a degree to which the address-mapping data is compressed, such that a combined size of the compressed address-mapping data and the ECC data is less than or equal to a page size of the non-volatile memory, and write the compressed address-mapping data and the ECC data to the storage device.

12. The storage device of claim 11, wherein the controller unit is further configured to:

select a first coding scheme of the plurality of coding schemes based on a determination that the address-mapping data is highly compressed; and select a second coding scheme of the plurality of coding schemes based on a determination that the address-mapping data is minimally compressed, wherein the first coding scheme is different than the second coding scheme.

13. The storage device of claim 11, wherein the controller unit is further configured to:

generate the ECC data by applying error correction encoding to the compressed address-mapping data according to the selected coding scheme;

store an indication of the selected coding scheme in the storage device;
read the compressed address-mapping data and the ECC data from the storage device;
select a decoding scheme of a plurality of decoding schemes based on the stored indication; and
apply error correction decoding to the data that is read from the storage device, the error correction decoding being applied according to the selected decoding scheme.

14. The storage device of claim 11, wherein the compressed address-mapping data and the ECC data are written to the non-volatile memory of the storage device.

* * * * *